(12) United States Patent
Chang et al.

(10) Patent No.: US 8,592,794 B2
(45) Date of Patent: Nov. 26, 2013

(54) RESISTANCE RANDOM ACCESS MEMORY ELEMENT AND METHOD FOR MAKING THE SAME

(75) Inventors: Ting-Chang Chang, Kaohsiung (TW);
Po-Chun Yang, Kaohsiung (TW);
Yu-Shih Lin, Kaohsiung (TW);
Shih-Ching Chen, Kaohsiung (TW);
Fu-Yen Jian, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 0 days.

(21) Appl. No.: 13/112,605

(22) Filed: May 20, 2011

(65) Prior Publication Data
US 2012/0068142 A1 Mar. 22, 2012

(30) Foreign Application Priority Data
Sep. 16, 2010 (TW) .................................. 99131517

(51) Int. Cl.
*H01L 47/00* (2006.01)
*H01L 21/04* (2006.01)

(52) U.S. Cl.
USPC .. 257/4; 438/510; 257/E45.002; 257/E21.004

(58) Field of Classification Search
USPC ........... 257/2–5, E21.004, E45.002, E45.003, 257/E47.001; 438/382, 468, 510
See application file for complete search history.

(56) References Cited

U.S. PATENT DOCUMENTS

| | | | |
|---|---|---|---|
| 6,418,049 B1 * | 7/2002 | Kozicki et al. | 365/174 |
| 2006/0181920 A1 * | 8/2006 | Ufert | 365/153 |
| 2010/0193758 A1 * | 8/2010 | Tian et al. | 257/2 |
| 2010/0193761 A1 * | 8/2010 | Amin et al. | 257/4 |
| 2010/0193762 A1 * | 8/2010 | Hsieh et al. | 257/4 |
| 2010/0232205 A1 * | 9/2010 | Parkinson | 365/148 |
| 2011/0089393 A1 | 4/2011 | Chang et al. | |
| 2011/0095255 A1 | 4/2011 | Sumino et al. | |

* cited by examiner

*Primary Examiner* — Daniel Luke
*Assistant Examiner* — Khaja Ahmad
(74) *Attorney, Agent, or Firm* — Muncy, Geissler, Olds & Lowe, PLLC

(57) ABSTRACT

A resistance random access memory element includes a first electrode, an insulating layer, a diffusing metal layer, and a second electrode superimposed in sequence. The insulating layer includes a plurality of pointed electrodes. A method for making a resistance random access memory element includes growing and forming an insulating layer on a surface of a first electrode. A diffusing metal layer is formed on a surface of the insulating layer. A second electrode is mounted on a surface of the diffusing metal layer. A negative pole and a positive pole of a driving voltage are connected with the first and second electrodes, respectively. The diffusing metal in the diffusing metal layer is oxidized into metal ions by the driving voltage. The metal ions are driven into the insulating layer and form a plurality of pointed electrodes after reduction.

6 Claims, 5 Drawing Sheets

RESISTANCE RANDOM ACCESS MEMORY ELEMENT AND METHOD FOR MAKING THE SAME

BACKGROUND OF THE INVENTION

1. Field of the Invention

The present invention relates to a memory element and a method for making the memory element and, more particularly, to a resistance random access memory element and a method for making the resistance random access memory element.

2. Description of the Related Art

Memories have been widely used and are necessary in various electronic products. Great attention has been put in research and development related to memories. Due to the advantages of high operating speeds, low power consumption, fewer limitation to miniature processing, and storage of multi-bit, resistance random access memories have the potential to replace non-volatile floating gate memories as the non-volatile memory elements of the next generation.

With reference to FIG. 1, a conventional resistance random access memory element generally includes a first electrode 91, a second electrode 92, and an insulating layer 93 coupled between the first and second electrodes 91 and 92. Voltage is applied to the first and second electrodes 91 and 92 to form a plurality of current conduction paths 94, generating resistance switching characteristics for use as a memory.

Since transition metal oxides generate resistance switching characteristics easily, the insulating layer 93 of a resistive non-volatile memory is usually made of a transition metal oxide in current researches. However, due to incompatibility between the transition metal oxides and current semiconductor manufacturing processes, the resistance random access memories made of transition metal oxides must be made by processes other than those for semiconductors, resulting in high manufacturing costs. Furthermore, still referring to FIG. 1, the insulating layer 93 is generally made of uniform material without structural flaws, the current conduction paths 94 randomly extend from the first electrode 91 towards the second electrode 92. The lengths and routes of the current conduction paths 94 are not fixed, such that the resistance changes every time the voltage is switched, resulting in unstable resistance.

On the other hand, although the manufacturing costs can be cut if the insulating layer 93 is made of an oxide, nitride, or nitrogen oxide of a semiconductor that is compatible with current semiconductor manufacturing processes, the resistance switching characteristics can not be easily generated in the semiconductor material. To obtain the resistance switching characteristics in the semiconductor material, the insulating layer 93 must have a thickness of 1-100 nm, or additional processes are required to dope metal into the semiconductor material or to diffuse metal into the semiconductor material at high temperature.

Furthermore, the disadvantages of unstable lengths and unstable routes of the current conduction paths 94 still exist. As a result, the resistance after switching is unstable.

Thus, a need exists for a novel resistance random access memory element and a method for making the resistance random access memory element.

SUMMARY OF THE INVENTION

An objective of the present invention is to provide a resistance random access memory element providing current conduction paths with enhanced stability.

Another objective of the present invention is to provide a resistance random access memory element including an insulating layer having a plurality of pointed electrodes.

Another objective of the present invention is to provide a method for making a resistance random access memory element.

A resistance random access memory element according to the present invention includes a first electrode, an insulating layer, a diffusing metal layer, and a second electrode superimposed in sequence. The diffusing metal layer is made of a diffusing metal. The insulating layer includes a plurality of pointed electrodes. Each of the plurality of pointed electrode is made of the diffusing metal. Thus, the switching resistance of the resistance random access memory element can be stabilized by the pointed electrodes.

A method for making a resistance random access memory element according to the present invention includes: an insulating layer making procedure including growing and forming an insulating layer on a surface of a first electrode; a diffusion metal layer making procedure including growing a diffusing metal on a surface of the insulating layer to form a diffusing metal layer, with the insulating layer located between the first electrode and the diffusing metal layer; an electrode making procedure including mounting a second electrode on a surface of the diffusing metal layer, with the diffusing metal layer located between the insulating layer and the second electrode; and a metal driving procedure including connecting a negative pole and a positive pole of a driving voltage with the first and second electrodes, respectively, with the diffusing metal in the diffusing metal layer being oxidized into metal ions by the driving voltage, with the metal ions driven into the insulating layer and forming a plurality of pointed electrodes after reduction. Thus, the manufacturing procedures can be simplified by forming the pointed electrodes through application of the driving voltage in the metal driving procedure.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

All figures are drawn for ease of explanation of the basic teachings of the present invention only; the extensions of the figures with respect to number, position, relationship, and dimensions of the parts to form the preferred embodiments will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

DETAILED DESCRIPTION OF THE INVENTION

Figure 1:
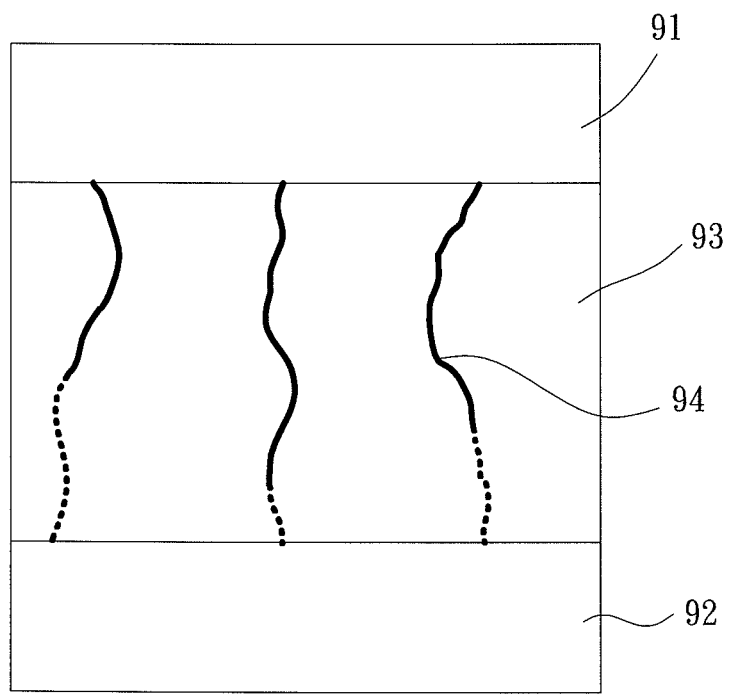
FIG. 1 shows a cross sectional view of a conventional resistance random access memory.
Figure 2:
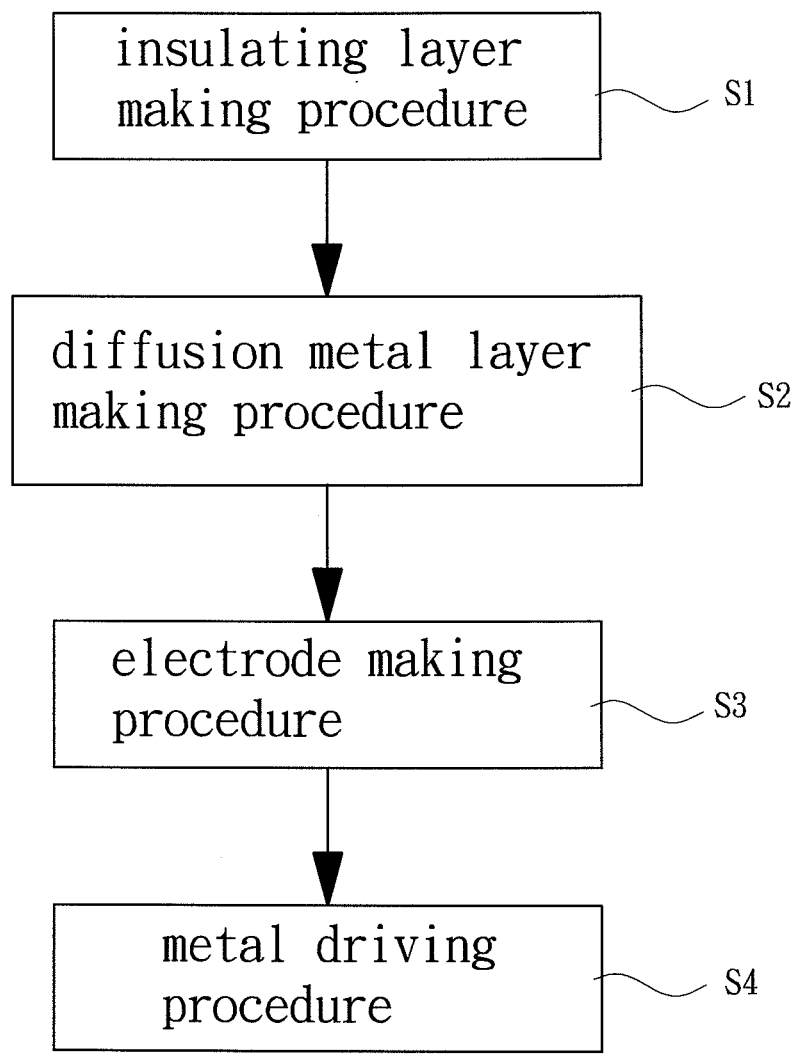
FIG. 2 shows a flowchart of a method for making a resistance random access memory element according to the present invention.

With reference to FIG. 2, a method for making a resistance random access memory element according to the present invention includes an insulating layer making procedure S1, a diffusion metal layer making procedure S2, an electrode making procedure S3, and a metal driving procedure S4.

Figure 3:
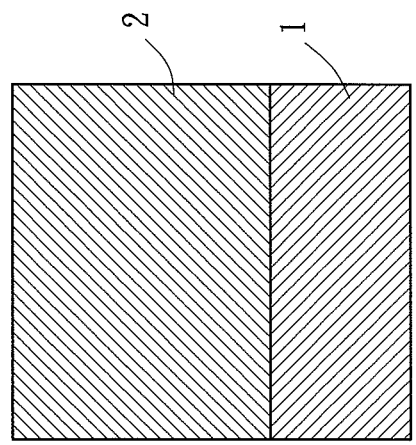
FIG. 3 shows a schematic view illustrating an insulating layer making procedure according to the present invention.

With reference to FIG. 3, the insulating layer making procedure S1 includes growing and forming an insulating layer 2 on a surface of a first electrode 1. More specifically, the first electrode 1 is preferably made of material with excellent conductivity, such as tungsten, aluminum, titanium, copper, nickel, silver, gold, or platinum. In this embodiment, the first electrode 1 is made of titanium nitride. The insulating layer 2 is deposited on the surface of the first electrode 1 by physical vapor deposition (such as sputtering) or chemical vapor deposition in this embodiment. The insulating layer 2 is made of a metal oxide, metal nitride, metal nitrogen oxide, or an oxide, nitride, nitrogen oxide of a semiconductor, such as aluminum oxide, titanium oxide, nickel oxide, zinc oxide, copper oxide, hafnium oxide, silicon-germanium oxide, or silicon oxynitride (SiON). In this embodiment, silicon oxynitride is deposited on the surface of the first electrode 1 made of titanium nitride by sputtering to form the insulating layer 2. The operating conditions of sputtering of the insulating layer 2 are as follows: the target is silicon oxynitride, argon is supplied at a flow rate of 20 sccm, the power is 80 W, the background pressure is 8 mtorr, and the deposition thickness is 35 nm.

Figure 4:
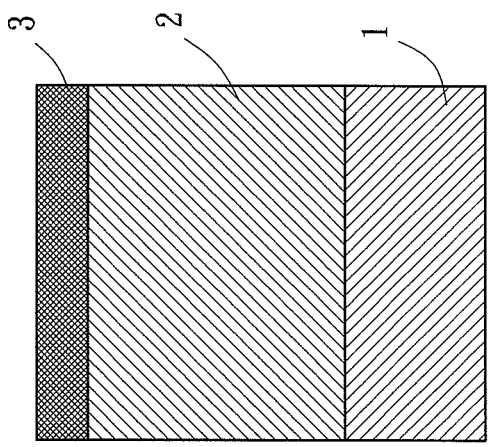
FIG. 4 shows a schematic view illustrating a diffusion metal layer making procedure according to the present invention.

With reference to FIG. 4, the diffusion metal layer making procedure S2 includes growing a diffusing metal on a surface of the insulating layer 2 to form a diffusing metal layer 3, such that the insulating layer 2 is located between the first electrode 1 and the diffusing metal layer 3. More specifically, the term "diffusing metal" used herein refers to a metal whose ions are diffusive in the insulating layer 2. Copper, silver, and alloys thereof can be used as the diffusing metal. Similar to the above procedure, the diffusing metal layer 3 can be made by physical vapor deposition or chemical vapor deposition. In an example, copper is deposited on the surface of the insulating layer 2 by sputtering to form the diffusing metal layer 3. The operating conditions of sputtering of the diffusing metal layer 3 are as follows: the target is copper, argon is supplied at a flow rate of 30 sccm, the power is 100 W, the background pressure is 8 mtorr, and the deposition thickness is 10 nm.

Figure 5:
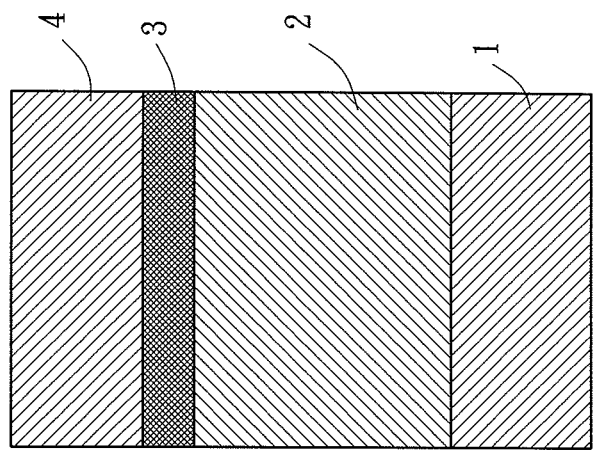
FIG. 5 shows a schematic view illustrating an electrode making procedure according to the present invention.

With reference to FIG. 5, the electrode making procedure S3 includes mounting a second electrode 4 on a surface of the diffusing metal layer 3, such that the diffusing metal layer 3 is located between the insulating layer 2 and the second electrode 4. More specifically, similar to the first electrode 1, the second electrode 4 is made of material with excellent conductivity. Furthermore, similar to the above procedures, the second electrode 4 can be formed by physical vapor deposition or chemical vapor deposition. In this embodiment, the second electrode 4 is formed by sputtering. The operating conditions of sputtering of the second electrode 4 are as follows: the target is platinum, argon is supplied at a flow rate of 30 sccm, the power is 100 W, the background pressure is 6 mtorr, and the deposition thickness is 200 nm.

Figure 6:
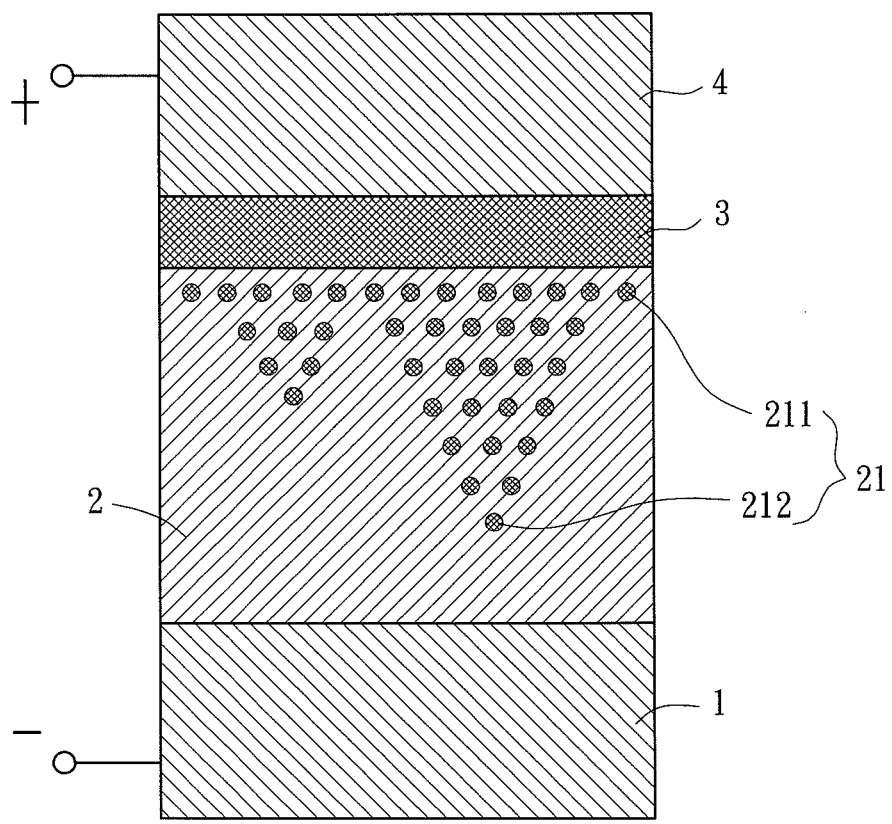
FIG. 6 shows a schematic view illustrating a metal driving procedure according to the present invention.

With reference to FIG. 6, the metal driving procedure S4 includes respectively connecting a negative pole and a positive pole of a driving voltage with the first and second electrodes 1 and 4. The diffusing metal in the diffusing metal layer 3 is oxidized into metal ions by the driving voltage. The metal ions are driven into the insulating layer 2 and form a plurality of pointed electrodes. More specifically, before switching of resistance occurs in the insulating layer 2 in the resistance random access memory element, flaws must be created in the insulating layer 2 by bias voltages before it can be utilized as a resistance random access memory element. This procedure is defined as a forming process and is irreversible. In this embodiment, the forming process is carried out after completion of the basic structure of the resistance random access memory element. Through external application of the driving voltage, the first and second electrodes 1 and 4 are respectively connected to the negative and positive poles of the driving voltage. The driving voltage is larger than a breakdown voltage of the insulating layer 2. The diffusing metal in the diffusing metal layer 3 is oxidized by the driving voltage into metal ions. The metal ions move towards the first electrode 1 under the action of the field created by the driving voltage. Thus, the metal ions move into the insulating layer 2 and are then reduced to metal atoms, forming a plurality of pointed electrodes 21 in the insulating layer 2. The pointed electrodes 21 point to the first electrode 1. Thus, the pointed electrodes 21 are made of a material the same as the diffusing metal layer 3. In this embodiment, the driving voltage is 20 V.

Thus, in the embodiment of the method for making the resistance random access memory element, after making the metal diffusing layer 3, a plurality of pointed electrodes 21 can be formed in the insulating layer 2 through the forming process that is necessary in the resistance random access memory element. No additional processes are required, simplifying the whole procedure and cutting the manufacturing costs.

A resistance random access memory element obtained by the above procedures according to the present invention is shown in FIG. 6 and includes a first electrode 1, an insulating layer 2, a diffusing metal layer 3, and a second electrode 4 that are superimposed in sequence.

With reference to FIG. 6, the first electrode 1 can be made of material of excellent conductivity, as mentioned above.

With reference to FIG. 6, the insulating layer 2 is mounted on the surface of the first electrode 1. As mentioned above, the insulating layer 2 is made of a metal oxide, metal nitride, metal nitrogen oxide, or an oxide, nitride, nitrogen oxide of a semiconductor, providing switching of resistance. The insulating layer 2 includes a plurality of pointed electrodes 21. As mentioned above, the pointed electrodes 21 are formed by reduction of metal ions in the insulating layer 2. The metal ions are generated from the diffusing metal layer 3 and are driven into the insulating layer 2. Thus, the pointed electrode 21 and the diffusing metal layer 3 are made of the same material. Each pointed electrode 21 includes a bottom 211 and a pointed portion 212. The bottom 211 is contiguous to the diffusing metal layer 3. The pointed portion 212 faces the first electrode 1. Due to formation of the pointed electrodes 21, the thickness of the insulating layer 2 can be reduced without adversely affecting the properties of the insulating layer 2, allowing easy occurrence of switching of resistance.

With reference to FIG. 6, the diffusing metal layer 3 is provided on the surface of the insulating layer 2, such that the insulating layer 2 is located between the first electrode 1 and the diffusing metal layer 3. The diffusing metal layer 3 is made of diffusing metal, such as copper, silver, or alloys thereof, whose ions can diffuse in the insulating layer 2 to form the pointed electrodes 21. Thus, the pointed electrodes 21 and the diffusing metal layer 3 are made of the same material.

With reference to FIG. 6, the second electrode 4 is mounted on the surface of the diffusing metal layer 3, such that the diffusing metal layer 3 is located between the insulating layer 2 and the second electrode 4. As mentioned above, the second electrode 4 is made of material of excellent conductivity.

Since pointed electrodes 21 exist in the insulating layer 2 and are located adjacent to the first electrode 1, when voltage is applied to the first electrode 1 and the second electrode 4, electric current moves from the second electrode 4 and the diffusing metal layer 3 through the pointed electrodes 21 and then to the first electrode 1. Thus, the lengths and routes of current conduction paths are stable due to provision of the pointed electrodes 21, stabilizing the switching resistance and switching operation.

Furthermore, in a case that the insulating layer 2 is made of a transition metal oxide, the pointed electrodes 21 further enhance the stability of resistance switching. Even if the material of the insulating layer 2 is a metal oxide, metal nitride, metal nitrogen oxide, or an oxide, nitride, nitrogen oxide of a semiconductor and, thus, has poorer resistance switching characteristics, the provision of the pointed electrodes 21 can significantly improve the resistance switching characteristics of the insulating layer 2. Thus, the thickness of the insulating layer 2 does not have to be smaller than 10 nm, reducing difficulties in manufacture.

Analysis of electrical measurements was conducted to prove the advantages of the resistance random access memory element of the present invention. A control group B (a conventional resistance random access memory element) and an experimental group A (a resistance random access memory element according to the present invention) were compared. The first electrodes 1 of both of the control group B and the experimental group A were made of titanium nitride. The second electrode 4 of both of the control group B and the experimental group A were made of platinum. The insulating layers 2 of both of the control group B and the experimental group A were made of silicon oxynitride (SiON). However, the experimental group A included a diffusing metal layer 3 made of copper.

Figure 7:
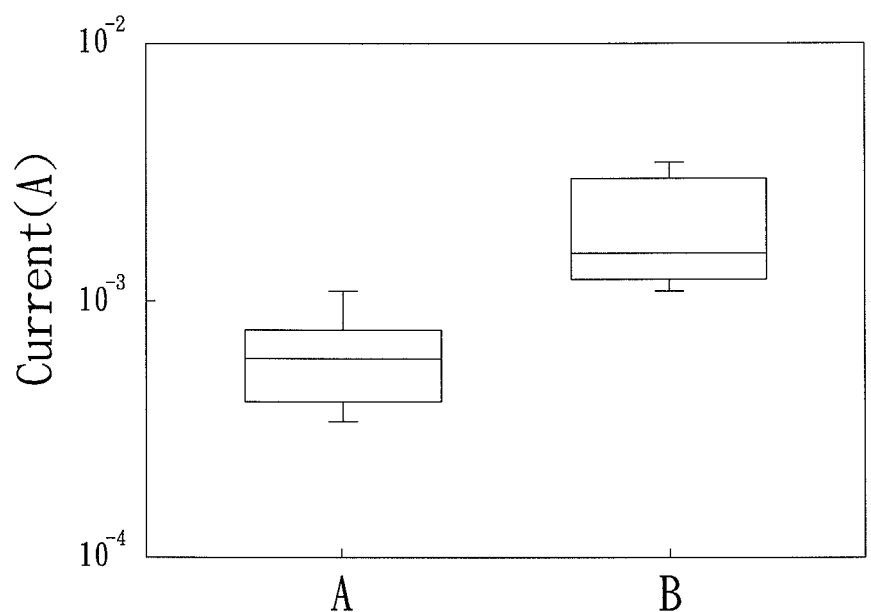
FIG. 7 shows a diagram illustrating current distributions of a control group and an experimental group in low resistance states.

FIG. 7 shows a diagram illustrating current distributions of the control group B and the experimental group A in low resistance states and in a voltage range. According to the result, the current distribution of the experimental group A was more stable than that of the control group B. Namely, the switching resistance of the present invention was more stable. Thus, it is confirmed that the resistance random access memory element and the method for making the resistance random access memory element according to the present invention can provide stable switching resistance.

Figure 8:
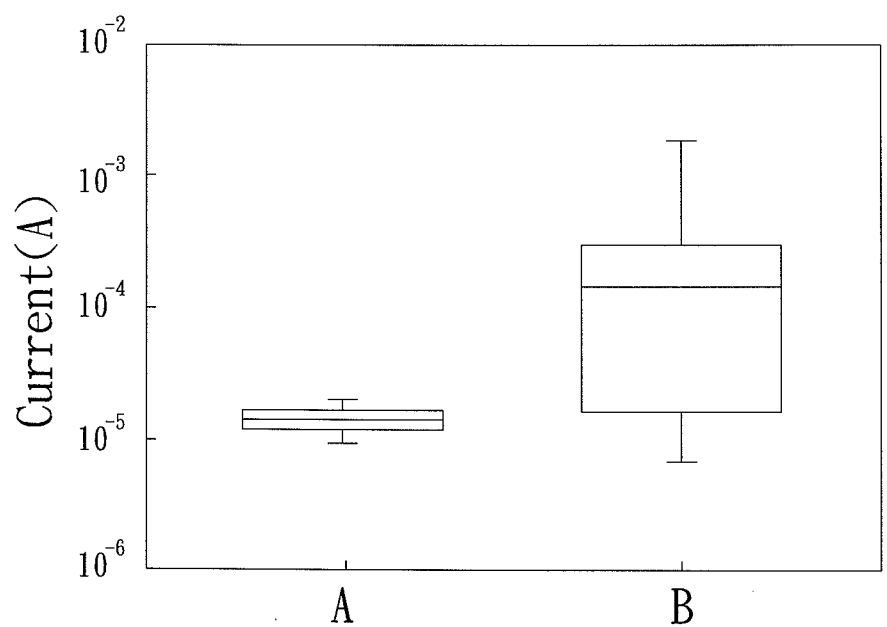
FIG. 8 shows a diagram illustrating current distributions of the control group and the experimental group in high resistance states.

FIG. 8 shows a diagram illustrating current distributions of the control group B and the experimental group A in high resistance states and in a voltage range. According to the result, the current distribution of the experimental group A was more stable than that of the control group B. Namely, the switching resistance of the present invention was more stable. Thus, it is confirmed that the resistance random access memory element and the method for making the resistance random access memory element according to the present invention can provide stable switching resistance.

Accordingly, through provision of the diffusing metal layer 3, the resistance random access memory element according to the present invention can drive metal ions into the insulating layer 2 to form the pointed electrodes 21 to reduce the thickness of the insulating layer 2 without adversely affecting the properties of the insulating layer 2. The lengths and routes of current conduction paths are stable due to provision of the pointed electrodes 21, stabilizing the switching resistance and switching operation.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A resistance random access memory element comprising a first electrode, an insulating layer, a diffusing metal layer, and a second electrode superimposed in sequence, with the diffusing metal layer made of a diffusing metal, with the insulating layer including a plurality of pointed electrodes, with each of the plurality of pointed electrode made of the diffusing metal;

with each of the plurality of pointed electrodes including a bottom and a pointed portion, with the bottom being contiguous to the diffusing metal layer, with the pointed portion facing the first electrode, with the pointed portion of each of the plurality of pointed electrodes spaced from the first electrode, and with a space between the pointed portion and the first electrode having no metal object;

the plurality of pointed electrodes including a plurality of discrete metal ions, wherein a number of metal ions gradually decreases from the bottom portion to the pointed portion of the plurality of pointed electrodes.

2. The resistance random access memory element as claimed in claim 1, with the diffusing metal layer made of copper, silver or an alloy thereof.

3. The resistance random access memory element as claimed in claim 1, with the insulating layer made of a metal oxide, metal nitride, metal nitrogen oxide, or an oxide, nitride, nitrogen oxide of a semiconductor.

4. A method for making a resistance random access memory element comprising:

an insulating layer making procedure: growing and forming an insulating layer on a surface of a first electrode;

a diffusion metal layer making procedure: growing a diffusing metal on a surface of the insulating layer to form a diffusing metal layer, with the insulating layer located between the first electrode and the diffusing metal layer;

an electrode making procedure: mounting a second electrode on a surface of the diffusing metal layer, with the diffusing metal layer located between the insulating layer and the second electrode; and a metal driving procedure: connecting a negative pole and a positive pole of a driving voltage with the first and second electrodes, respectively, with the diffusing metal in the diffusing metal layer being oxidized into metal ions by the driving voltage, with the metal ions driven into the insulating layer and forming a plurality of pointed electrodes after reduction;

with each of the plurality of pointed electrodes including a bottom and a pointed portion, with the bottom being contiguous to the diffusing metal layer, with the pointed portion facing the first electrode, with the pointed portion of each of the plurality of pointed electrodes spaced from the first electrode, and with a space between the pointed portion and the first electrode having no metal object;

the plurality of pointed electrodes including a plurality of discrete metal ions, wherein a number of metal ions gradually decreases from the bottom portion to the pointed portion of the plurality of pointed electrodes.

5. The method for making the resistance random access memory element as claimed in claim 4, with growing the diffusing metal in the diffusion metal layer making procedure including using copper, silver, or an alloy thereof as the diffusing metal and growing the diffusing metal on the surface of the insulating layer to form the diffusing metal layer.

6. The method for making the resistance random access memory element as claimed in claim 4, wherein the driving voltage is larger than a breakdown voltage of the insulating layer.

\* \* \* \* \*